US007865326B2

(12) United States Patent
Johnson et al.

(10) Patent No.: US 7,865,326 B2
(45) Date of Patent: Jan. 4, 2011

(54) COMPACT INPUT MEASUREMENT MODULE

(75) Inventors: Chris S. Johnson, Round Rock, TX (US); Christopher D. White, Round Rock, TX (US); Glen E. Clifton, Austin, TX (US); James J. Truchard, Austin, TX (US); Garritt W. Foote, Austin, TX (US)

(73) Assignee: National Instruments Corporation, Austin, TX (US)

( * ) Notice: Subject to any disclaimer, the term of this patent is extended or adjusted under 35 U.S.C. 154(b) by 684 days.

(21) Appl. No.: 10/928,383

(22) Filed: Aug. 27, 2004

(65) Prior Publication Data

US 2005/0234681 A1 Oct. 20, 2005

Related U.S. Application Data

(60) Provisional application No. 60/563,871, filed on Apr. 20, 2004.

(51) Int. Cl.
*G01D 1/00* (2006.01)
*H05K 7/10* (2006.01)
*H05K 7/16* (2006.01)

(52) U.S. Cl. .................. 702/127; 710/301; 361/727

(58) Field of Classification Search ................ 702/188, 702/127, 117, 33, 57, 85, 108, 113, 116–118; 710/2, 100, 104, 300–305, 313; 361/724–733, 361/748, 752, 754, 756; 439/325, 327, 374, 439/526, 527, 620.01
See application file for complete search history.

(56) References Cited

U.S. PATENT DOCUMENTS 4,715,826 A * 12/1987 Collier et al. ............... 439/438

5,038,305 A * 8/1991 Kumar et al. ............... 702/94
5,293,636 A * 3/1994 Bunton et al. .............. 710/104
5,473,507 A 12/1995 Schwegler et al.

(Continued)

FOREIGN PATENT DOCUMENTS

WO WO 00/72167 5/2000

(Continued)

OTHER PUBLICATIONS

Iwase et al., 3.125Gbps×8 Channels Parallel Interconnection Module with Low Height MT Receptacle Connector for Single Mode Fibers, 2002 Electronic Components and Technology Conference, pp. 292-299.*

(Continued)

*Primary Examiner*—Michael P Nghiem
*Assistant Examiner*—Toan M Le
(74) *Attorney, Agent, or Firm*—Meyertons Hood Kivlin Kowert & Goetzel, P.C.; Jeffrey C. Hood

(57) ABSTRACT

In some embodiments, an input measurement module may be configured to insert into a slot of a carrier using alignment guide slots and corresponding guide projections. Clips on the input measurement module or the carrier may engage corresponding depressions to secure the input measurement module to the carrier. The clips may be spring-loaded. The input measurement module may include a first outer casing and a second outer casing coupled together around a circuit board that interfaces with a backplane of the carrier through a backplane connector.

31 Claims, 12 Drawing Sheets

U.S. PATENT DOCUMENTS

| | | | |
|---|---|---|---|
| 5,641,313 A | | 6/1997 | Hohorst |
| 5,687,387 A | * | 11/1997 | Endejan et al. .................. 710/2 |
| 5,716,241 A | | 2/1998 | Hennemann et al. |
| 5,868,261 A | * | 2/1999 | Collins et al. .................. 211/26 |
| 5,896,485 A | * | 4/1999 | Kirby ......................... 385/134 |
| 5,912,801 A | | 6/1999 | Roy et al. |
| 5,971,804 A | | 10/1999 | Gallagher et al. |
| 5,999,365 A | | 12/1999 | Hasegawa et al. |
| 6,052,278 A | * | 4/2000 | Tanzer et al. ................. 361/685 |
| 6,061,244 A | | 5/2000 | O'Sullivan et al. |
| 6,134,612 A | * | 10/2000 | Bailey et al. ................... 710/62 |
| 6,155,723 A | | 12/2000 | Behr et al. |
| 6,166,919 A | * | 12/2000 | Nicolici et al. ............... 361/800 |
| 6,167,425 A | | 12/2000 | Beckhoff |
| 6,178,359 B1 | * | 1/2001 | Dobyns ...................... 700/117 |
| 6,246,585 B1 | * | 6/2001 | Gunther et al. ............. 361/759 |
| 6,247,078 B1 | | 6/2001 | Ebert et al. |
| 6,260,155 B1 | | 7/2001 | Dellacona |
| 6,272,016 B1 | | 8/2001 | Matonis et al. |
| 6,288,902 B1 | * | 9/2001 | Kim et al. .................... 361/725 |
| 6,297,962 B1 | * | 10/2001 | Johnson et al. ............. 361/726 |
| 6,317,329 B1 | * | 11/2001 | Dowdy et al. ............... 361/725 |
| 6,317,334 B1 | * | 11/2001 | Abruzzini et al. ........... 361/685 |
| 6,320,734 B1 | * | 11/2001 | Sonobe et al. ............... 361/103 |
| 6,351,786 B2 | * | 2/2002 | Elmore et al. ............... 710/303 |
| 6,506,071 B2 | | 1/2003 | Lange |
| 6,556,438 B1 | | 4/2003 | Bolognia et al. |
| 6,614,662 B2 | | 9/2003 | Stickler et al. |
| 6,679,646 B2 | | 1/2004 | Quardt et al. |
| 6,733,344 B2 | | 5/2004 | Quardt et al. |
| 6,762,941 B2 | * | 7/2004 | Roth ........................... 361/736 |
| 6,781,822 B1 | * | 8/2004 | Mercer et al. ............... 361/683 |
| 6,801,973 B2 | * | 10/2004 | Wu ............................. 710/301 |
| 6,823,283 B2 | | 11/2004 | Steger et al. .................. 702/27 |
| 6,891,728 B1 | * | 5/2005 | Mease et al. ................ 361/724 |
| 6,912,132 B2 | | 6/2005 | Riddiford et al. |
| 6,948,021 B2 | | 9/2005 | Derrico et al. |
| 6,950,895 B2 | * | 9/2005 | Bottom ....................... 710/301 |
| 6,952,659 B2 | * | 10/2005 | King et al. .................. 702/186 |
| 6,956,744 B2 | * | 10/2005 | Willis et al. ................. 361/724 |
| 6,968,414 B2 | * | 11/2005 | Abbondanzio et al. ...... 710/301 |
| 7,012,815 B2 | | 3/2006 | Garnett et al. |
| 7,013,352 B2 | * | 3/2006 | Garnett .......................... 710/1 |
| 7,062,575 B2 | * | 6/2006 | Garnett et al. .................. 710/1 |
| 7,079,381 B2 | * | 7/2006 | Brehm et al. ............... 361/685 |
| 7,099,158 B1 | * | 8/2006 | Bjorklund ................... 361/725 |
| 7,215,556 B2 | * | 5/2007 | Wrycraft ..................... 361/802 |
| 7,307,851 B2 | * | 12/2007 | Dimarco ..................... 361/753 |
| 7,542,867 B2 | * | 6/2009 | Steger et al. ................ 702/127 |
| 2001/0010619 A1 | | 8/2001 | Manweiler et al. |
| 2002/0078290 A1 | | 6/2002 | Derrico et al. |
| 2003/0074489 A1 | * | 4/2003 | Steger et al. .................. 710/1 |

FOREIGN PATENT DOCUMENTS

| | | |
|---|---|---|
| WO | WO 00/60437 | 12/2000 |
| WO | WO 01/50708 | 12/2000 |
| WO | WO 02/008891 | 7/2001 |
| WO | WO 02/069076 | 12/2001 |
| WO | WO 02/101573 | 6/2002 |

OTHER PUBLICATIONS

"Measurement and Automation Catalog 2003," National Instruments.

http://web.archive.org/web/20040202184106/http://www.ab.com/catalogs/b113/io/1794.html, dated Feb. 2, 2004 (3 pages).

http://web.archive.org/web/20040410012938/http://www.ni.com/swf/fieldpoint/us/launch.htm, dated Apr. 10, 2004 (6 pages).

http://support.automation.siemens.com/WW/llisapi.dll?func=cslib.csinfo&lang=en&objid=1142798&caller=view, dated Oct. 2002 with Nov. 2003 supplement (240 pages).

Answers@Acromag, Signal Conditioning and Distributed I/O Solutions, Product Summary Guide, 2003 (16 pages).

http://web.archive.org/web/20040417040923/http://advantech.com/products/Model.asp?Category_ID=1-D6G11&bu=, dated Apr. 17, 2004 (3 pages).

http://web.archive.org/web/20040609225844/www.advantech.com.tw/products/, dated Apr. 17, 2004 (3 pages).

The Data Acquisition Team for Superior Road Simulation Testing—MTS and SoMat, http://web.archive.org/web/20040316061251/http://www.mts.com/downloads/100-071-489_SoMat_eDAQ.pdf Copyright 2002, (8 pages).

ArmorBlock MaXum, Product Profile, Copyright 2002, (2 pages).

ArmorBlock MaXum 16 Input Module with Complete Diagnostics, Aug. 2002 (16 pages).

http://web.archive.org/web/20040204181625/http://www.wago.com/web/index.php?country=us&language=en&key=95, dated Feb. 4, 2004 (2 pages).

DEWE-5000 PC Instrument, Jun. 2003 (2 pages).

DEWE-4000 IPC, Jun. 2003 (2 pages).

DEWE-RACK, Dec. 2002 (3 pages).

Signal Conditioning Solutions, Jul. 1999 (12 pages).

DEWE-2010 PC Instruments, Oct. 2002 (3 pages).

DEWE-3010 PC Instruments, Jun. 2003 (3 pages).

DEWE-600 IPC Jun. 2003 (2 pages).

DA-400 Rack-Mounting Industrial PC System, Copyright 2000 (5 pages).

DA-100-TC Precision Temperature Recorder Operation Manual, Copyright 2003 (43 pages double sided).

EPAD-V8-P, Feb. 2004 (2 pages).

Wago-I/O-System 750, Oct. 10, 2002 (2 pages).

"RLX Technologies™ Redefining Server Economics"; White Paper; May 2001; pp. 1-15; http://www.isp-planet.com/img/progriles/RLX_Paper.pdf.

HP Blade Server Data Sheet; Nov. 2001; http://www.cypress-systems.com/PDFs/pdf_35.pdf.

* cited by examiner

COMPACT INPUT MEASUREMENT MODULE

PRIORITY CLAIM

This application claims benefit of priority of U.S. provisional application Ser. No. 60/563,871 titled "Compact Measurement Module" filed Apr. 20, 2004, whose inventors are Chris S. Johnson, Christopher D. White, Glen E. Clifton, James J. Truchard, and Garritt W. Foote.

BACKGROUND OF THE INVENTION

1. Field of the Invention

The present invention relates generally to measurement and instrumentation systems and, more specifically, to measurement modules.

2. Description of the Related Art

Scientists and engineers often use measurement or instrumentation systems to perform a variety of functions, including laboratory research, process monitoring and control, data logging, analytical chemistry, test and analysis of physical phenomena, and control of mechanical or electrical machinery, to name a few examples. An instrumentation system typically includes transducers and other detecting means for providing "field" electrical signals representing a process, physical phenomena, equipment being monitored or measured, etc. The instrumentation system typically also includes interface hardware for receiving the measured field signals and providing them to a processing system, such as a personal computer. The processing system typically performs data analysis and presentation for appropriately analyzing and displaying the measured data.

Often, the field signals may be linked to high common-mode voltages, ground loops, or voltage spikes that often occur in industrial or research environments that could damage the computer system. In that case, the instrumentation system typically includes isolation circuitry such as optocouplers for eliminating ground-loop problems and isolating the computer from potentially damaging voltages. Input measurement modules may be provided for conditioning the raw field voltage signals by amplifying, isolating, filtering or otherwise converting the signals to the appropriate digital signals for the computer system. As one example, the digital signals are then provided to a plug-in data acquisition (DAQ) input/output (I/O) board, or a computer-based instrument that is plugged into one of the I/O slots of a computer system. Generally, the computer system has an I/O bus and connectors or slots for receiving I/O boards. Various computer systems and I/O buses may be used to implement a processing system for receiving the measurements. The computer may receive measurements from multiple sources, where, for example, different sources may interface with the computer through respective input measurement modules.

SUMMARY OF THE INVENTION

Various embodiments of the invention may comprise a measurement module for use in a measurement system. In various embodiments, the measurement system may include a computer system coupled to a measurement or data acquisition (DAQ) device. A measurement/sensor interface may comprise a carrier and one or more input measurement modules adapted to be included in the carrier. In various embodiments, the carrier may comprise a chassis, a backplane, and one or more slots for receiving input measurement modules. Each of the one or more slots may include a connector that is coupled to the backplane to interface with one or more input measurement modules. The input measurement modules may include a connector coupled to a circuit board inside the input measurement module. In some embodiments, the connector may be offset from a middle of the input measurement module to allow for more components to be placed on the circuit board and backplane and to assist in correct placement of the input measurement module in the carrier. The carrier may be operable to communicate with each input measurement module and be programmed or configured (e.g., by the computer system or by a processor on the carrier) to implement a respective interface of each input measurement module and a device coupled to the input measurement module.

In various embodiments, the input measurement module may be inserted into a slot of the carrier through alignment of a guide slot on the input measurement module with a corresponding guide projection on the carrier. In some embodiments, the guide projection may be on the input measurement module and the guide slot on the carrier. In some embodiments, an asymmetric guide slot on an opposing side of the input measurement module may also align with a corresponding asymmetric guide projection on the carrier. The guide slots and guide projections may prevent an input measurement module from being inserted in an incorrect orientation.

In various embodiments, a clip on the input measurement module may engage a corresponding depression on the carrier to secure the input measurement module to the carrier. In some embodiments, a clip on an opposing side of the input measurement module may engage another depression on the carrier to further secure the input measurement module in the carrier. In some embodiments, the clips may be on the carrier and the corresponding depressions may be located on the input measurement module. In some embodiments, the clips may be spring-loaded.

In various embodiments, an input measurement module may include a first outer casing and a second outer casing to enclose a circuit board. The first outer casing may at least partially wrap around the second outer casing. For example, a portion of the first outer casing may overlap at least a portion of the second outer casing to enclose a circuit board. Screws or other fastening means may couple the first outer casing to the second outer casing through corresponding holes in the casings. The circuit board may be positioned within the first and second outer casing by spacers on the inside of the casings. In some embodiments, fasteners, such as screws, may be used to couple the first and second outer casings together. For example, two screws placed near the connector may couple the first and second outer casing and the backplane connector on the circuit board.

BRIEF DESCRIPTION OF THE DRAWINGS

A better understanding of the present invention may be obtained when the following detailed description is considered in conjunction with the following drawings, in which.

Figure 1A:
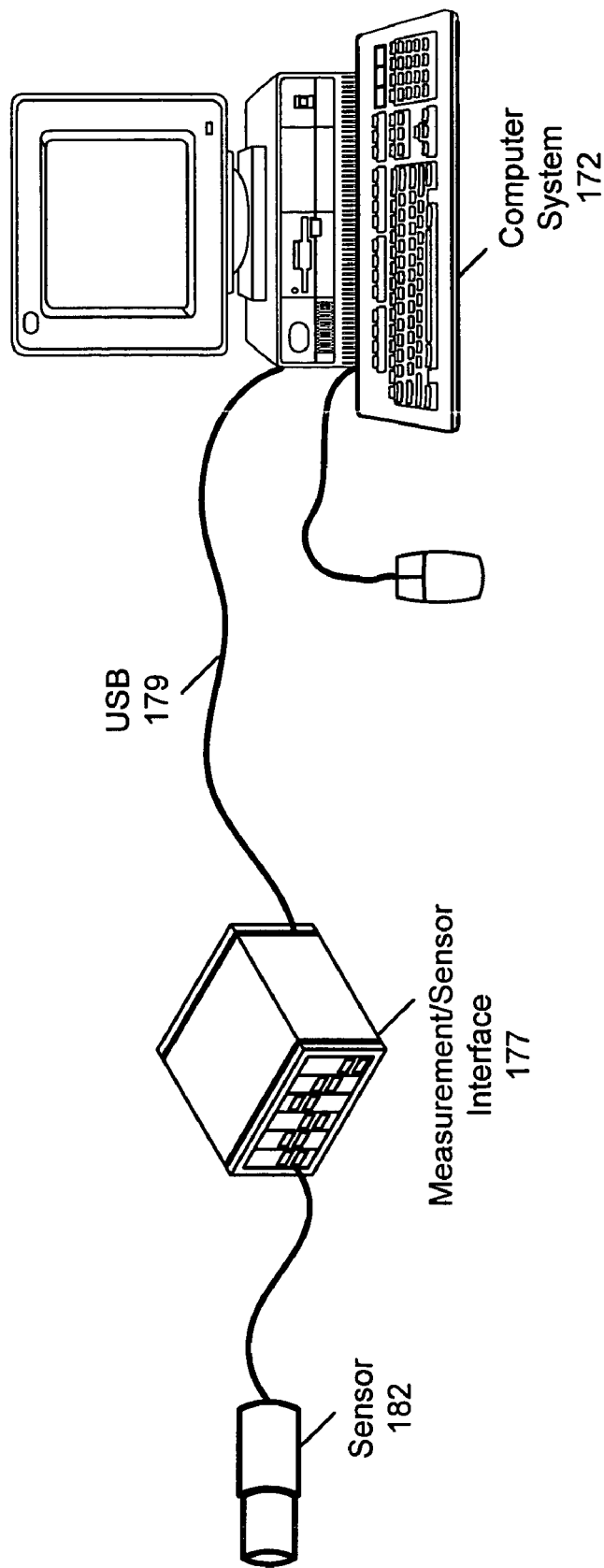
FIG. 1A illustrates a view of an embodiment of a computer system coupled to a measurement/sensor interface.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION OF THE INVENTION

U.S. patent application Ser. No. 10/195,051, now U.S. Pat. No. 7,542,867, titled "Measurement System with Modular Measurement Modules That Convey Interface Information" filed on Jul. 12, 2002 whose inventors are Perry Steger, Garritt W. Foote, David Potter, and James J. Truchard is hereby incorporated by reference in its entirety as though fully and completely set forth herein.

Figure 1B:
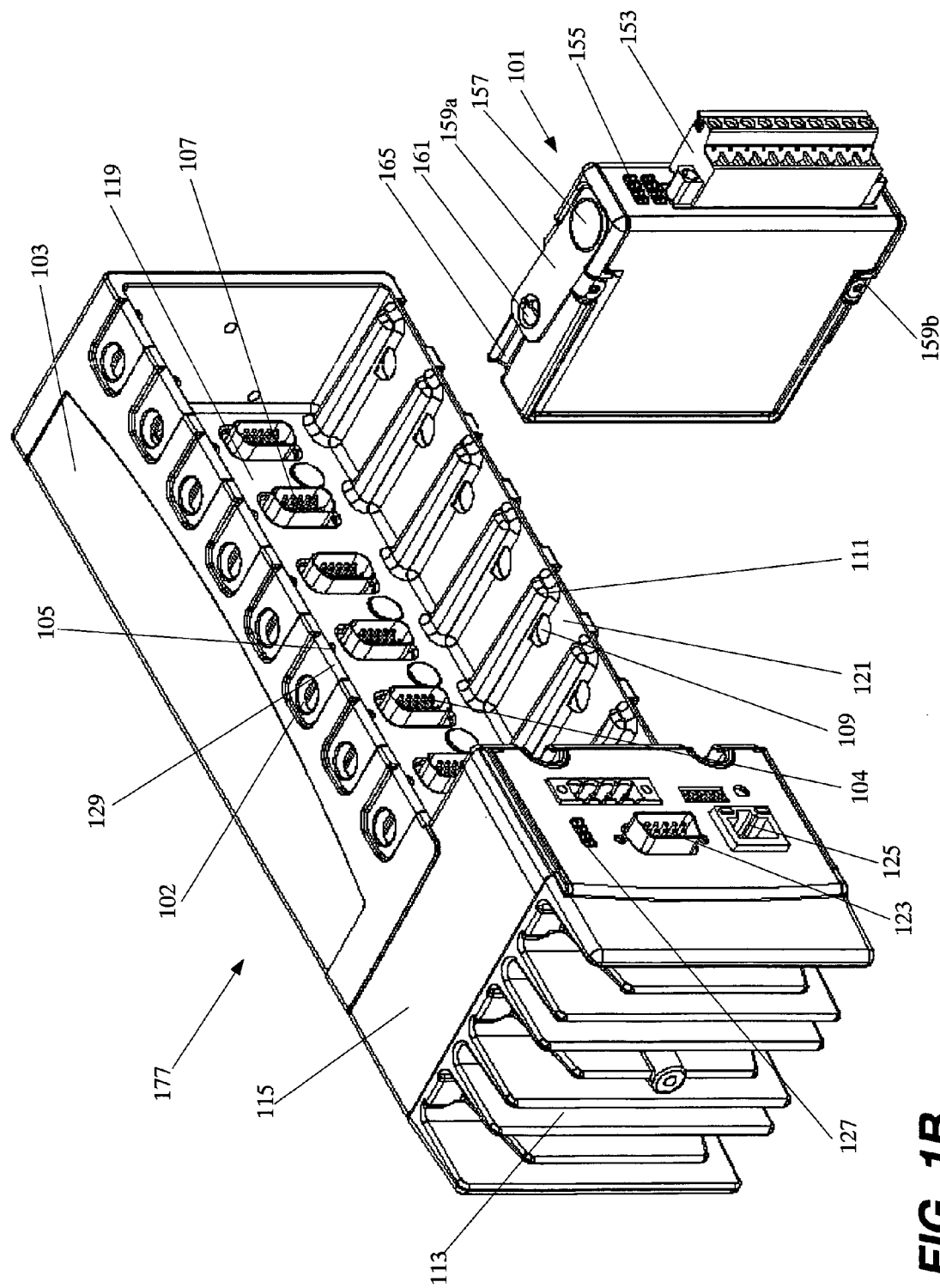
FIG. 1B illustrates an isometric view of an input measurement module and a measurement/sensor interface, according to an embodiment.

FIGS. 1A and 1B: Measurement System Overview

FIG. 1A illustrates a view of an embodiment of a computer system 172 (e.g., a host computer) coupled to a measurement/sensor interface 177. The computer system 172 may be a personal computer or a laptop. Other computer systems 172 are also contemplated. For example, in some embodiments, the computer system 172 may be a server coupled to a network. In some embodiments, a measurement system may include a measurement/sensor interface (or measurement device) 177 (e.g., a data acquisition (DAQ) device) coupled to sensor (or transducer) 182. As used herein, the term "measurement device" is intended to include any of various types of devices that are operable to acquire, generate, and/or store data, which may optionally be further operable to analyze or process the acquired or stored data. Examples of a measurement device include various types of instruments, such as oscilloscopes, multimeters, data acquisition devices or cards, devices external to a computer that operate similarly to a data acquisition cards, smart sensors, one or more DAQ or input measurement modules in a chassis, and other similar types of devices.

The sensor 182 may couple to the measurement/sensor interface 177 through an input measurement module 101 (as seen in FIG. 1B). Signals from a sensor 182, coupled to the measurement/sensor interface 177 through an input measurement module 101, may be conditioned and/or analyzed, and corresponding signals may be sent from the measurement/sensor interface 177 to the computer system 172.

The computer system 172 coupled to the measurement/sensor interface 177 may comprise a CPU, a display screen, memory, and one or more input devices such as a mouse or keyboard, and may operate with the measurement/sensor interface 177 to analyze data, measure data, or control the sensor and/or device providing the data. Alternatively, the computer system 172 may be used only to configure or program the sensor 182, i.e., through the measurement/sensor interface 177.

In some embodiments, the measurement/sensor interface 177 may be coupled to a computer system 172 through a Universal Serial Bus (USB) cable 179. Other cables and connection types are also contemplated. For example, in various embodiments, the computer system 172 may couple to the measurement/sensor interface 177 through other medium including Ethernet, wireless media such as IEEE 802.11 (Wireless Ethernet) Bluetooth, a network, such as a Control Area Network (CAN) or the Internet, serial or parallel buses, or any other transmission means. In some embodiments, the measurement/sensor interface 177 may be installed on a din rail, a panel, a rack, or a desktop. Other locations for the measurement/sensor interface 177 are also contemplated.

FIG. 1B illustrates an isometric view of an embodiment of an input measurement module 101 and a measurement/sensor interface 177 for use in a measurement system. In some embodiments, the sensor 182 may be coupled to the input measurement module 101. In some embodiments, the sensor 182 may couple to an input measurement module 101 through input connector 153. In some embodiments, connectivity to the input measurement module 101 may be facilitated by 9 to 62 position d-subs, thermocouples, combicons, Bayonet Neill-Concelman (BNC) connectors, SubMiniature B (SMB) connectors, banana jacks, and/or RJ-45 connectors, among others. The input measurement module 101 may be inserted into a carrier 103 of the measurement/sensor interface 177.

Carrier

In various embodiments, the measurement/sensor interface 177 may comprise a carrier 103, a backplane 119 comprised in the carrier 103, a controller 115, and one or more slots 121 comprised in the carrier 103. The carrier 103 may protect the input measurement module 101 and provide an interface, through the controller 115, between the input measurement module 101 and the computer system 172 coupled to the carrier 103. In various embodiments, each of the one or more slots 121 may include a connector 107 that is coupled to the backplane 119. Input measurement module 101 may couple to the backplane 119 through a connector 107. The carrier 103 may interface with a plurality of input measurement modules 101 through the multiple slots, each of which may provide measurement and/or control functionality for a measurement or control operation or task. In some embodiments, a heat sink 113 may be coupled to the carrier 103 to dissipate heat.

In some embodiments, the carrier 103 may be operable to communicate with each input measurement module 101 and be programmed or configured (e.g., by the computer system or by a processor on the carrier 103) to implement the respective interface of each input measurement module 101. In this manner a suite of sensors may be fielded, each of which feeds signals to a respective input measurement module 101 that in turn communicates through a respective interface (protocol)

with the carrier 103. The carrier 103 may in turn couple to a computer system. In some embodiments, the carrier 103 may support different configurations for the slots. For example, 4 slots may be passive and 4 slots active. Other configurations (e.g., 8 slot active and 16 slot active) may also be supported. Thus, the carrier 103 may support a heterogeneous plurality of interfaces without having to include a heterogeneous set of interface hardware components.

In some embodiments, the measurement/sensor interface 177 may also provide additional features including additional connectors and indicator lights 127. For example, an RJ-45 connector 125 (e.g., for Ethernet) and a DB-9 connector 123 (e.g., for serial connection) may be provided on a controller 115 coupled to the carrier 103. Indicator lights 127 may also be provided (for example, for power, status, and user indications). In addition, a reset switch and a 5 position dual inline package (DIP) switch may also be provided on the controller 115. In some embodiments, a 4 pos combicon may be used for power. Other switches and power sources are also contemplated.

Input Measurement Module

In some embodiments, the input measurement module 101 may be operable to couple to a sensor or actuator. The sensor 182 may receive signals from a device or unit under test (UUT) and may send sensor signals to the input measurement module 101, e.g., for one or more of signal conditioning and signal conversion. For example, the sensor may measure a phenomenon, such as temperature, pressure, voltage, current, or any other phenomenon, and send corresponding signals to the input measurement module 101. The signal conditioner comprised in the input measurement module 101 may then perform signal conditioning on the signals, where signal conditioning may include one or more of protection, isolation, filtering, amplification, and excitation, or any other signal conditioning operations. The conditioned signals may then be processed by the signal converter, also comprised in the input measurement module 101, which may be operable to perform one or more of analog to digital (A/D) conversion and digital to analog (D/A) conversion of the signal, depending on whether the signal is analog or digital. The conditioned, converted signals may then be transmitted by the interface circuitry to the carrier 103 using the specified interface protocol. In other words, the input measurement module 101 may transmit the conditioned, converted signals to the carrier 103 over the serial transmission medium SCSI parallel interface (SPI). The carrier 103 may then further analyze the signals or transmit the signals to an external system, such as a computer system. The input measurement module 101 may also include additional transmission lines and/or buses for operation, e.g., a trigger line coupled to the ADC that may receive trigger signals from an external source, such as the computer system, and a power line for supplying power to the input measurement module 101, among others.

In some embodiments, the input measurement module 101 may be in the form of a measurement cartridge, and the carrier 103 may be a "RIO" Reconfigurable Input/Output carrier to receive one or more of the measurement cartridges. As used herein, the term "RIO" carrier 103 refers to a carrier 103 that includes reconfigurable hardware that is configurable with respective interface protocols for one or more input measurement modules. In other words, a RIO carrier 103 with multiple slots 321 may be configured with multiple interfaces for inserted input measurement modules 101, such that each cartridge's interface is implemented by the RIO carrier 103. For example, if three input measurement modules with three different respective interfaces are inserted in three slots of the RIO carrier 103, then the RIO carrier 103 may be configured to implement the three interfaces. Similarly, if multiple input measurement modules are sequentially inserted into and removed from a particular slot, the RIO carrier 103 may be configured respectively for each input measurement module 101, i.e., sequentially. The RIO carrier 103 may further be operable to couple to any of various products or platforms.

In some embodiments, the input measurement modules 101 may be easily removed, added, and replaced. In other words, input measurement modules 101 may be exchanged to change the configuration or capabilities of the measurement system. In some embodiments, the input measurement module 101 may be replaced without powering down the measurement system, i.e., the input measurement module 101 may be "hot-plugged" into the carrier 103, where the input measurement module 101 may communicate the interface protocol information to the carrier 103 upon attachment, and the carrier 103 is programmed in response. In some embodiments, the input measurement module 101 and/or carrier 103 may require a reboot or reset after attachment to perform the described initialization. Thus, the interface circuitry (i.e., the input measurement module 101) may be operable to communicate the interface protocol to the carrier 103 upon one or more of attachment of the input measurement module 101 to the carrier 103, reset of the input measurement module 101, reset of the carrier 103, reboot of the input measurement module 101, and reboot of the carrier 103. In some embodiments, the input measurement module 101 may provide information (e.g., a status of measurement circuitry interface) through indicator lights 155 (e.g., light emitting diodes (LEDs)). Multiple indicator lights 155 may be used for multiple status signals.

In various embodiments, an input measurement module 101 may be inserted into a slot (e.g., slot 121) through alignment of a guide slot 165 with a corresponding guide projection 105. In some embodiments, an asymmetric guide slot on an opposing side of the input measurement module 101 from the guide slot 165 may align with a corresponding asymmetric guide projection 111 (or other asymmetric module insertion guide). The asymmetric guide slot may prevent incorrect insertion of the input measurement module 101 into the carrier 103 (which may correspondingly prevent damage to backplane connector pins). In some embodiments, the guide slots and guide projections on opposing sides of the measurement module 101 may not be asymmetric. In some embodiments, guide slots may be provided on the carrier 103 and guide projections may be provided on the input measurement module 101. In addition, a carrier may have a combination of guide projections and guide slots (e.g., to align different input measurement modules in a specified order). In some embodiments, a side of the input measurement module 101 may be flat to correspond with a flat portion of a slot in the carrier 103 (i.e., the flat portion of the input measurement module 101 may align with the flat portion of the carrier 103 to guide the input measurement module 101).

In some embodiments, a latch, such as clip 159a, with a clip projection 161 may engage a corresponding depression 102a on the carrier 103 to secure the input measurement module 101 to the carrier 103. In some embodiments, a clip 159b on an opposing side of the input measurement module 101 from the clip 159a may engage another depression 102b to further secure the input measurement module 101 in the carrier 103.

In some embodiments, the clips 159 may be spring-loaded. For example, a user may press on the clips (e.g., at portion 157) to counter the spring force and raise the clip projections 161 out of the corresponding depressions 102a in the carrier 103 and remove the input measurement module 101. In some embodiments, clips 159 may be coupled to the carrier 103 and depressions 102a, 102b may be provided on the input measurement module 101. While the carrier 103 in FIG. 1B is shown horizontal, the carrier 103 may also be used in other configurations (e.g., the carrier 103 may be vertical). In various embodiments, the carrier 103 may enclose various amounts of the input measurement module 101 when the input measurement module 101 is inserted into the carrier 103. Similarly, the clips 159 may be of various lengths corresponding to the size of the carrier 103. In some embodiments, foam 129 may be provided on the interior of the carrier 103 between the carrier 103 and the input measurement module 101 (when the input measurement module 101 is inserted). The foam 129 may further secure the input measurement module 101 and prevent rattling as the input measurement module 101 is inserted and removed.

Figure 2:
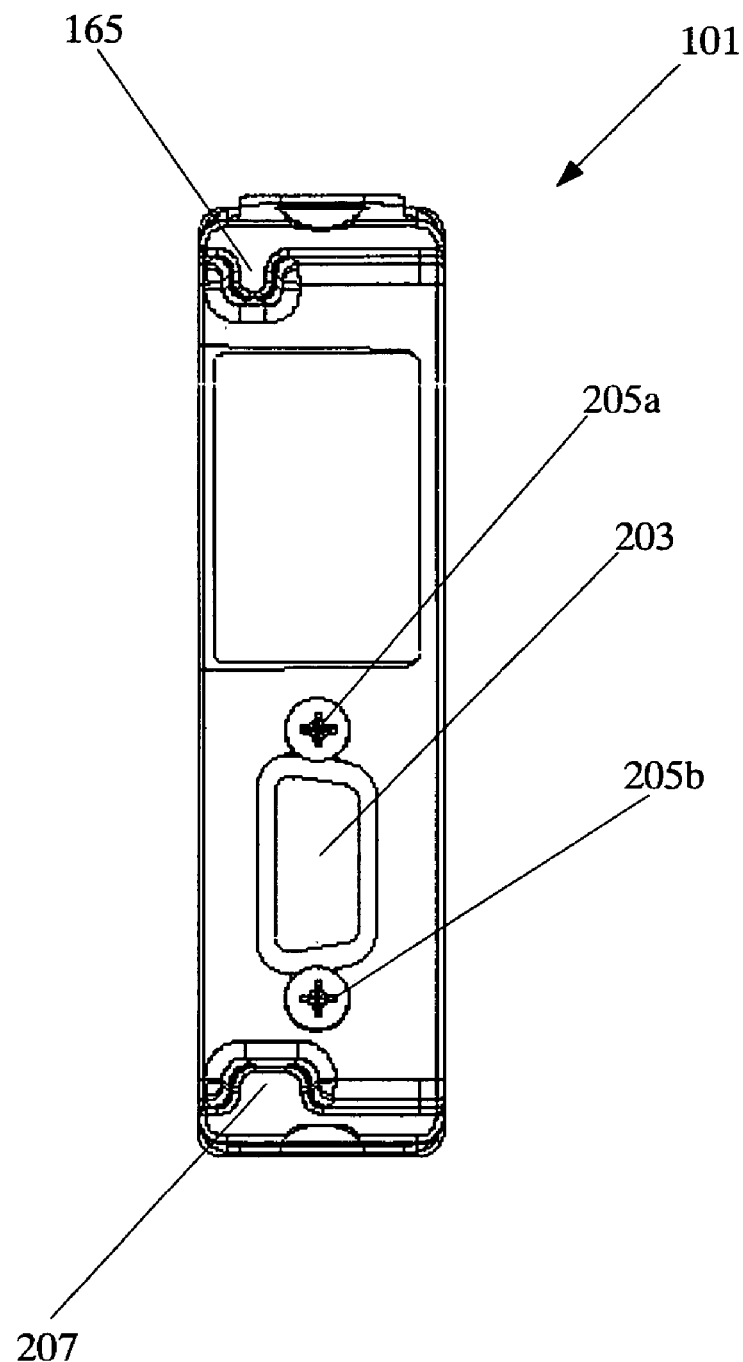
FIG. 2 illustrates an end view of an input measurement module, according to an embodiment.

FIG. 2: End View of Input Measurement Module

FIG. 2 illustrates an end view of an embodiment of the input measurement module 101. In some embodiments, asymmetric guide slots 165, 207 may be used to guide input measurement module 101 into carrier 103. The asymmetric guide slots 165 and 207 may have different dimensions such that if a user attempted to insert the input measurement module 101 into the carrier 103 upside down, one of the asymmetric guide slots 165, 207 would be too narrow for the corresponding guide projection. In some embodiments, screws 205a, 205b may be used to couple the outer casings of the input measurement module 101 together with an internal circuit board that interfaces with a backplane through connector 203. In some embodiments, screws 205 may be countersink screws. Other fastening mechanisms may also be used to couple portions of the outer casing together (e.g., clips, adhesive, rivets, and welds).

In some embodiments, the casing may be made of metal (e.g., sheet metal and/or die cast metal) to facilitate thermal cooling (e.g., without air vents) in the input measurement module 101. In addition, the metal casing may be rugged and impact resistant. In some embodiments, the input measurement module 101 may have air vents and/or may be made of a different material. The connector 203 may be a 15 pos HD d-sub connector (with the female connector on the input measurement module 101). Other type connectors 203 may also be used. In some embodiments, the connector 203 may be coupled to and offset from a center of a back surface of the input measurement module 101. For example, the connector 203 may be positioned substantially in the center of the first or second half of a back edge of the input measurement module 101. Other offsets are also contemplated. Because the connector 203 is offset from the center, more room may be provided on the circuit board for circuitry. The offset connector 203 may also allow for larger contiguous areas on the backplane for chips (e.g., for field programmable gate-arrays (FPGAs)). In addition, the offset connector 203 will assist in preventing incorrect insertion (and corresponding bent wires on the connector 203) of the input measurement module 101. Labels (e.g., a serial number and model number label) may also be placed on the back of the input measurement module 101 near the connector 203, or elsewhere on the input measurement module 101, as desired.

Figure 3:
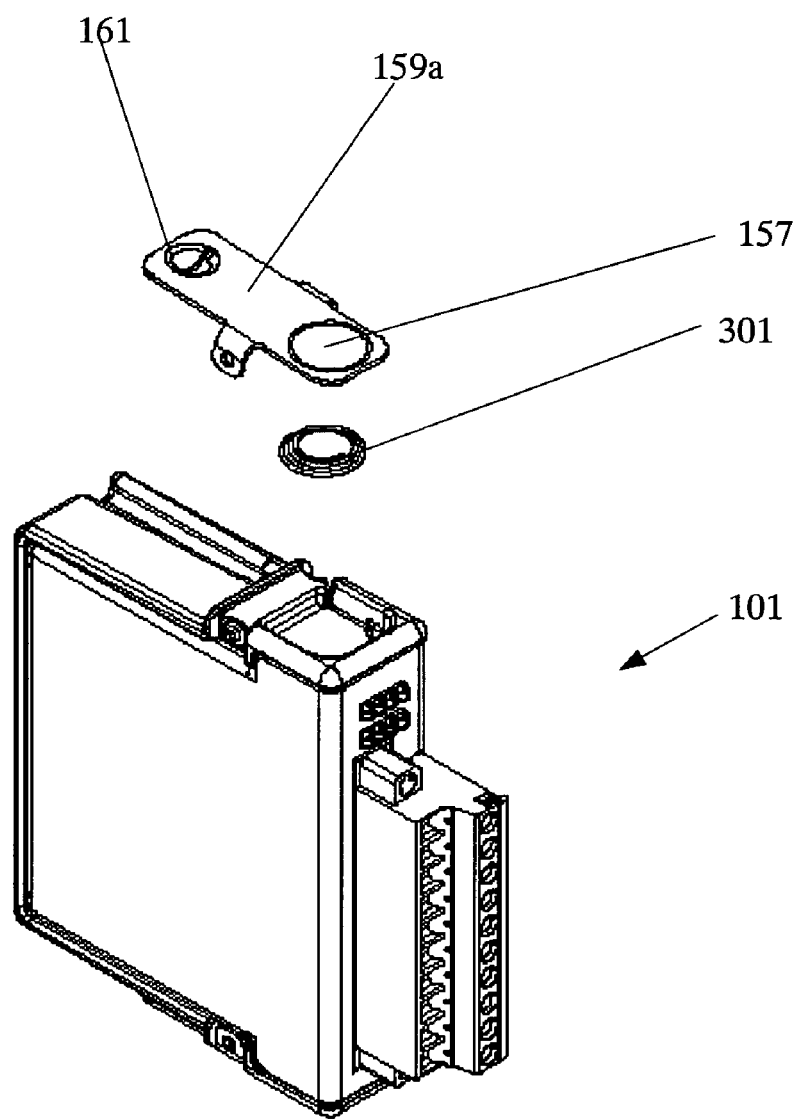
FIG. 3 illustrates an expanded view of a clip for the input measurement module, according to an embodiment.

FIG. 3: Input Measurement Module Clip

FIG. 3 illustrates an expanded view of an embodiment of a clip 159 for the input measurement module 101. In some embodiments, clip 159 may be spring loaded (e.g., a spring 301 may oppose section 157 of the clip 159 to bias the clip projection 161 downward). Other locations for the spring 301 are also contemplated. In an embodiment, the spring 301 may be helical, although other shapes may also be used. In some embodiments, the clip 159 may not be biased by a spring 301. For example, the clip 159 may be fastened to the input measurement module 101 and the material used in the clip 159 may have an inherent flexibility that allows a clip projection 161 to snap and unsnap onto depression 102a as the input measurement module 101 is inserted into the carrier 103. In some embodiments, the clips may be on the carrier 103 and corresponding depressions may be on the input measurement module 101.

Figure 4:
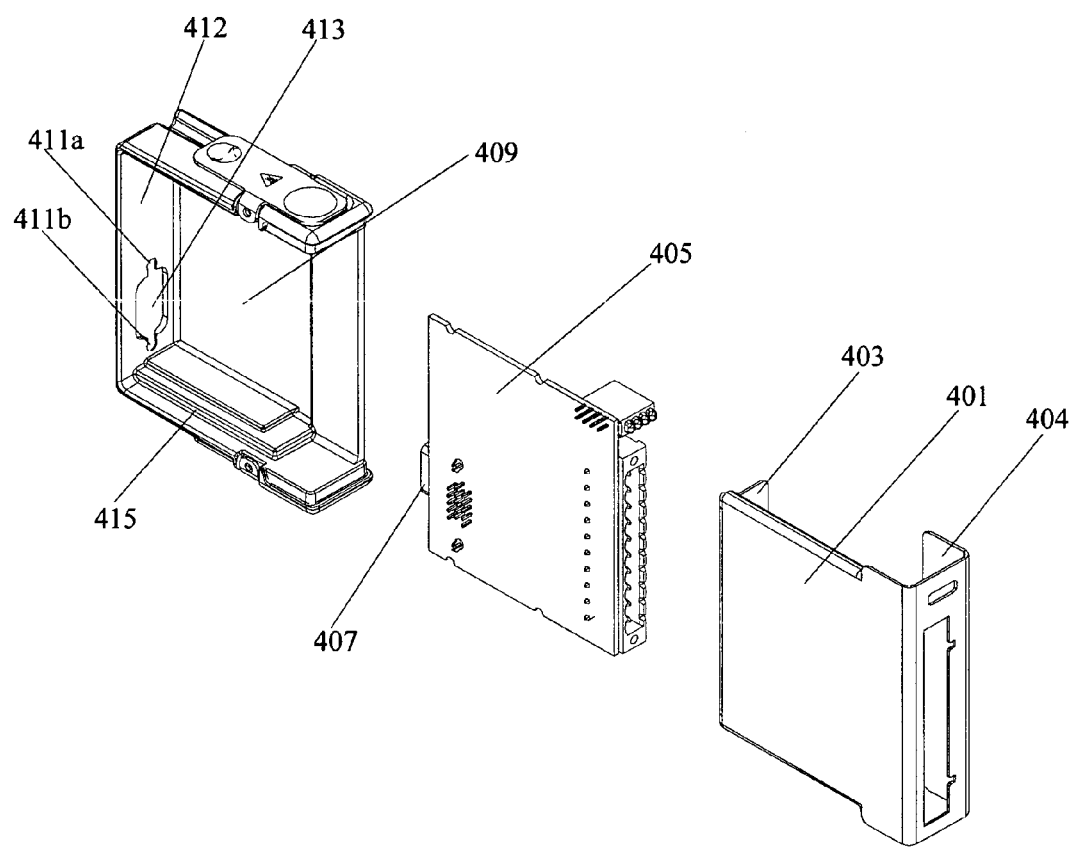
FIG. 4 illustrates an expanded view of an input measurement module, according to an embodiment.

FIG. 4: Internal View of Input Measurement Module

FIG. 4 illustrates an expanded view of an embodiment of an input measurement module 101. In some embodiments, an input measurement module 101 may include a first outer casing 401 and a second outer casing 409. In some embodiments, first outer casing 401 may overlap at least a portion of the second outer casing 409. For example, casing lips 403, 404 may overlap at least a portion of the second outer casing 409 to enclose a circuit board 405. Screws 205 (FIG. 2) may couple the first outer casing 401 and the second outer casing 409 together through holes 411a and 411b. In some embodiments, holes 411 may be proximate to the backplane connector 407. In some embodiments, countersink screws may be used. Backplane connector 407 may protrude through hole 413. In some embodiments, the first outer casing 401 and second outer casing 409 may be disassembled by removing the two screws 205. In some embodiments, the circuit board 405 may also be removed from the first outer casing 401 and the second outer casing 409 when the two screws are removed. This configuration may decrease assembly and disassembly time as well as make repairs faster. In some embodiments, more than two pieces may be used for the casing. In some embodiments, the outer casing may be a single piece casing enclosing the circuit board 405. In some embodiments, insulating sheets (e.g., made of plastic) may be applied along inside portions of the outer casings 401 and 409 to further insulate the circuit card. In some embodiments, coatings and/or finishes may be applied to the outer casings 401 and 409. For example, coatings to ground various surfaces of the outer casings 401 and 409 and/or protective coatings on various surfaces of the outer casings 401 and 409 may be used to further protect the input measurement module 101 and the internal circuit board 405.

Figure 5:
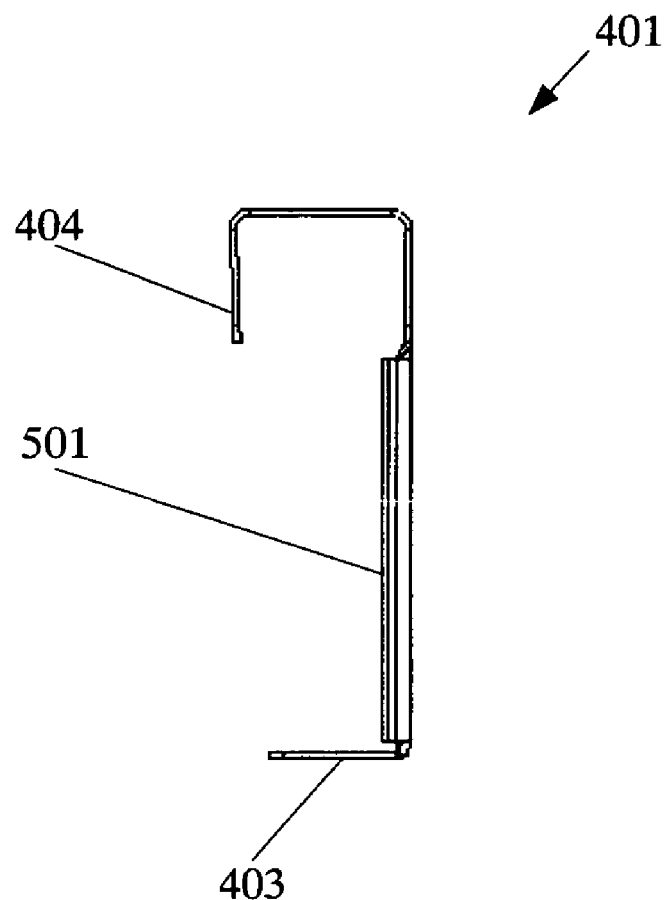
FIG. 5 illustrates a side view of a first outer casing for the input measurement module, according to an embodiment.

FIG. 5: Side View with Spacers

FIG. 5 illustrates a side view of an embodiment of a first outer casing for the input measurement module. In some embodiments, a spacer 501 may be used to hold a circuit board in place when the casing encloses the circuit board. The spacers 501 may position the circuit board to align a connector on the circuit board with a hole in the casing. The spacers 501 may also keep the circuit board from rattling and or vibrating when the input measurement module is in use. In some embodiments, the spacers 501 may be opposed by spacers on the second outer casing (e.g., spacer 415 in FIG. 4). The spacers 501 may be a curled edge of the bottom of the first outer casing 401. In some embodiments, opposing edges of the first outer casing 401 may be curled to position the circuit board on both sides. Other spacers may also be used. For example, a circular rubber spacer may be affixed to the inside of the first outer casing 401 using adhesive. Other materials and shapes may also be used.

Figure 6:
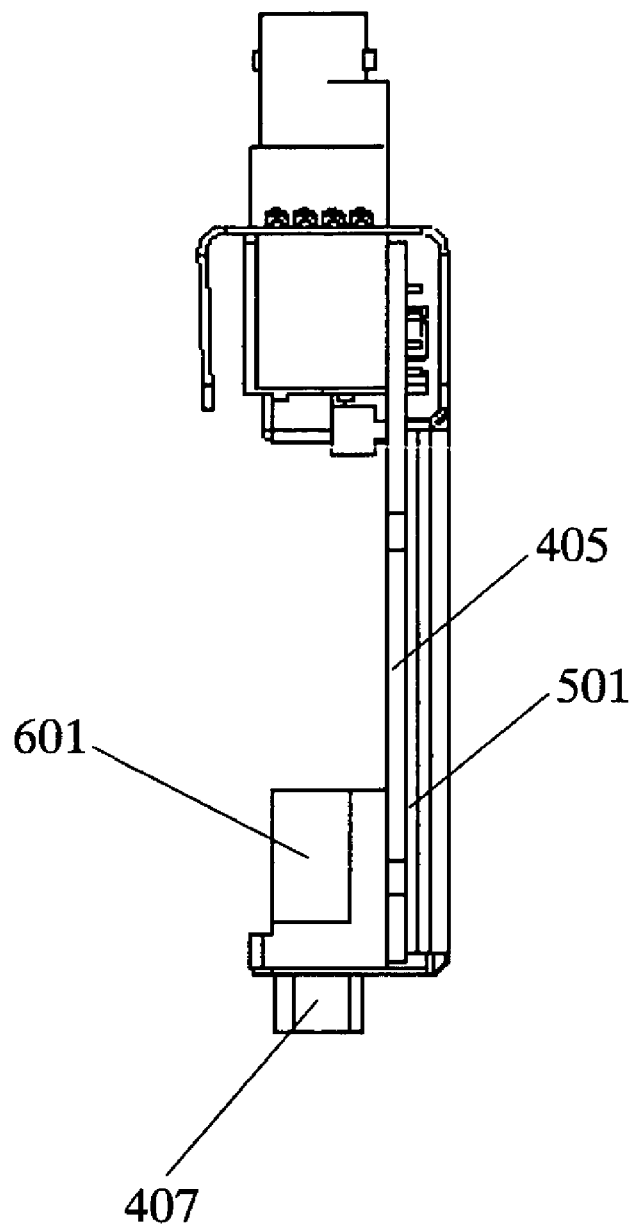
FIG. 6 illustrates a side view of a first outer casing for the input measurement module partially enclosing a circuit board, according to an embodiment.

FIG. 6: Side View with Circuit Board

FIG. 6 illustrates a side view of an embodiment of a first outer casing 401 for the input measurement module partially enclosing a circuit board 405. In some embodiments, circuit board 405 may be positioned by spacer 501. In some embodiments, spacers 501 and opposing spacers 415 may hold the circuit board when enclosed by the first and second outer casings. In some embodiments, additional screws and fasteners may not be needed to position or hold the circuit board 405. The spacers may allow the first outer casing 401 and the second outer casing to enclose the circuit board 405 with a limited number of fasteners. For example, two screws 205a, 205b used through backplane connector casing 601 may be used to hold together the first outer casing 401, the second outer casing, and the circuit board 405. In some embodiments, only one screw or fastener may be used. Using a limited number of fasteners may allow the casing to be disassembled and reassembled quickly.

Figure 7A:
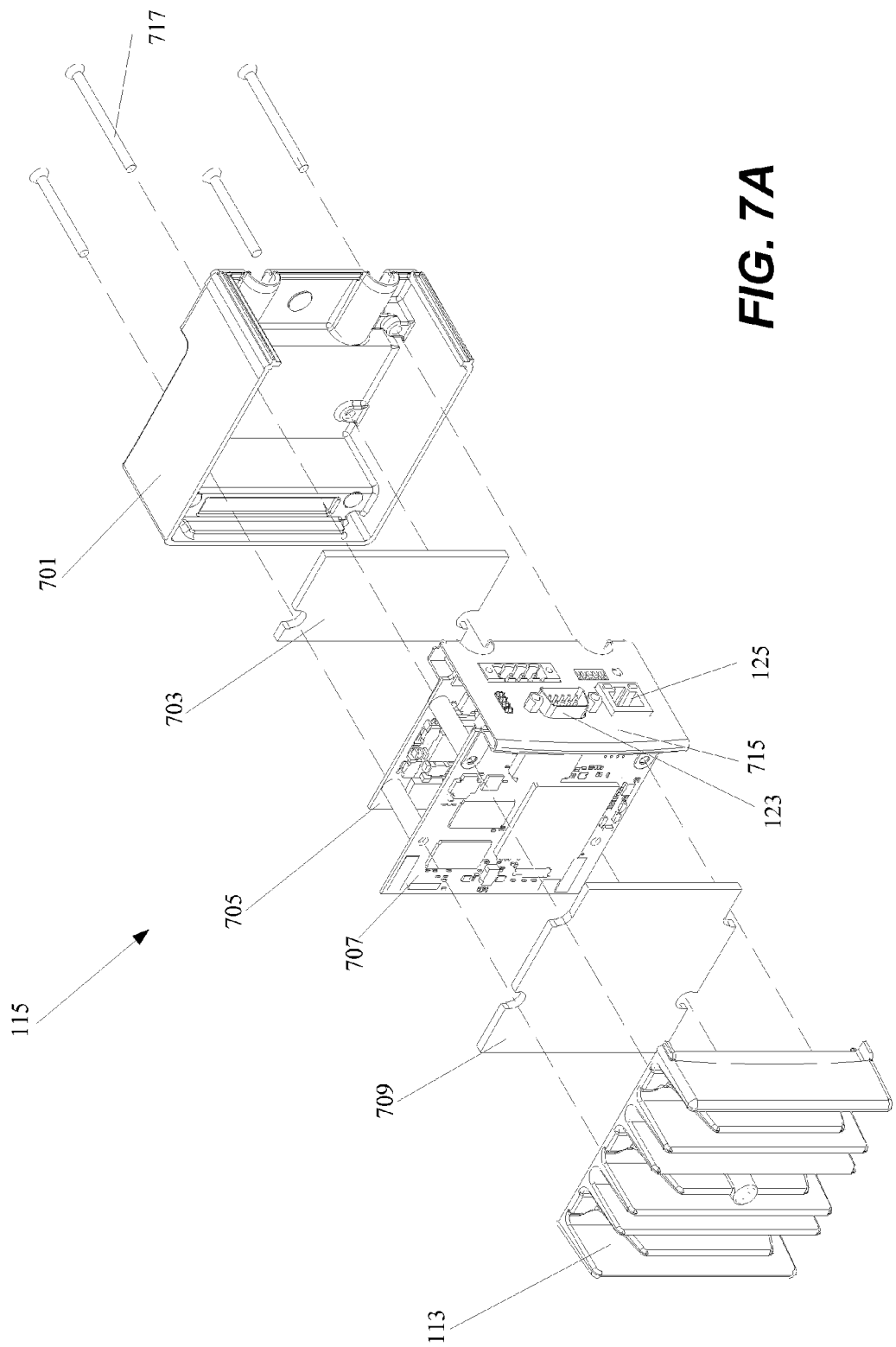
FIGS. 7A and 7B illustrate an expanded view of a controller portion of a measurement/sensor interface, according to an embodiment.
Figure 7B:
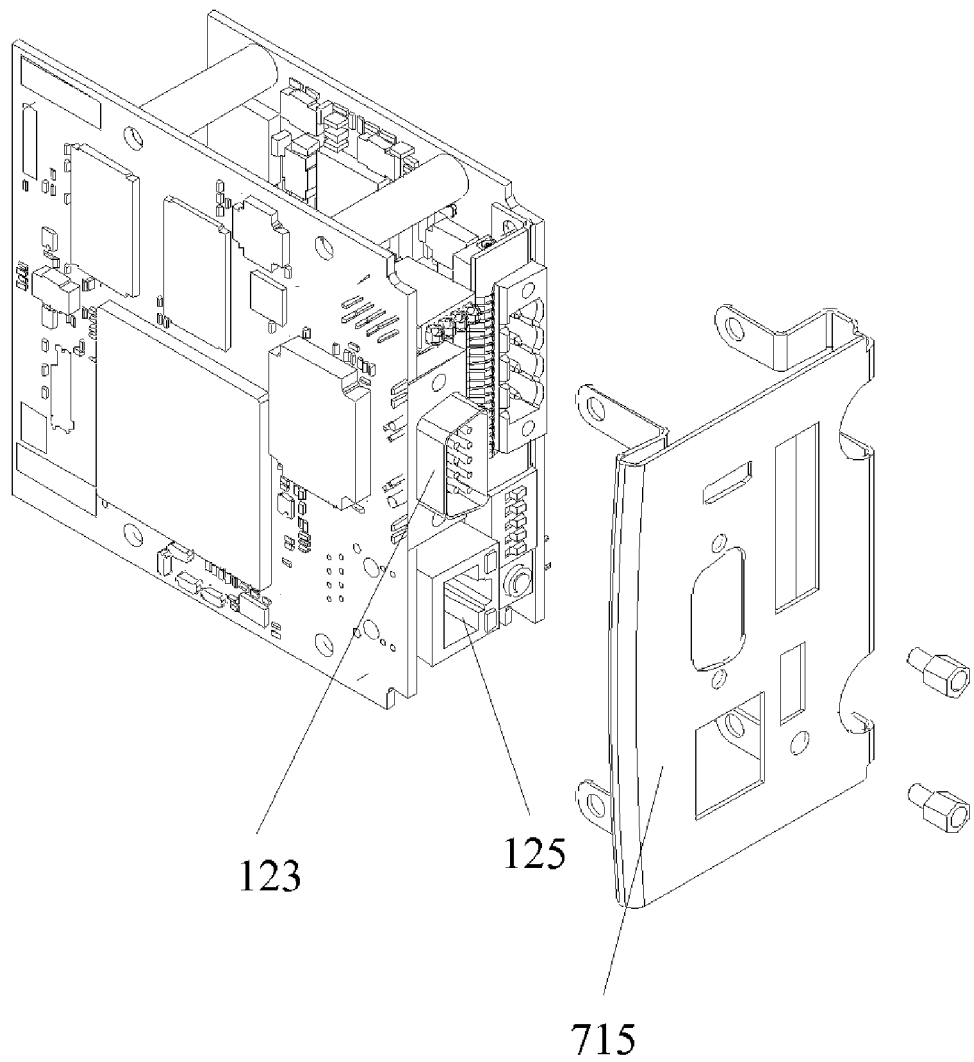

FIGS. 7A and 7B: Carrier Controller Mechanism

FIGS. 7A and 7B illustrate an expanded view of an embodiment of a controller portion of a carrier 103. In one embodiment, the controller 115 may have a heat sink 113, processor board 707, and power supply board 705. FIG. 7B shows another view of the processor board 707, power supply board 705, and faceplate 715. In various embodiments, the heat sink 113 may be fabricated from any of various materials, and/or by various processes. For example, the heat sink 113 may be cast (e.g., cast aluminum or copper), formed from sheet metal, etc. Other heat sinks are also contemplated. In some embodiments, gap pads may be provided to facilitate heat transfer. For example, gap pad 709 between a processor board 707 and heat sink 113 and gap pad 703 between power supply board 705 and enclosure 701 may facilitate heat transfer between the processor board 707 and the heat sink 113 and the power supply board 705 and the enclosure 701. In some embodiments, the enclosure 701 may include a base covered by cosmetic sheet metal. In some embodiments, the base may be die cast aluminum or formed from another process or material (e.g., molded copper). Other configurations for the enclosure 701 are also contemplated. Screws 717 may couple the components of the controller together. Screws (not shown) may couple the controller 115 to the carrier 103. A face plate 715 may be provided over connectors 123 and 125.

Figure 8:
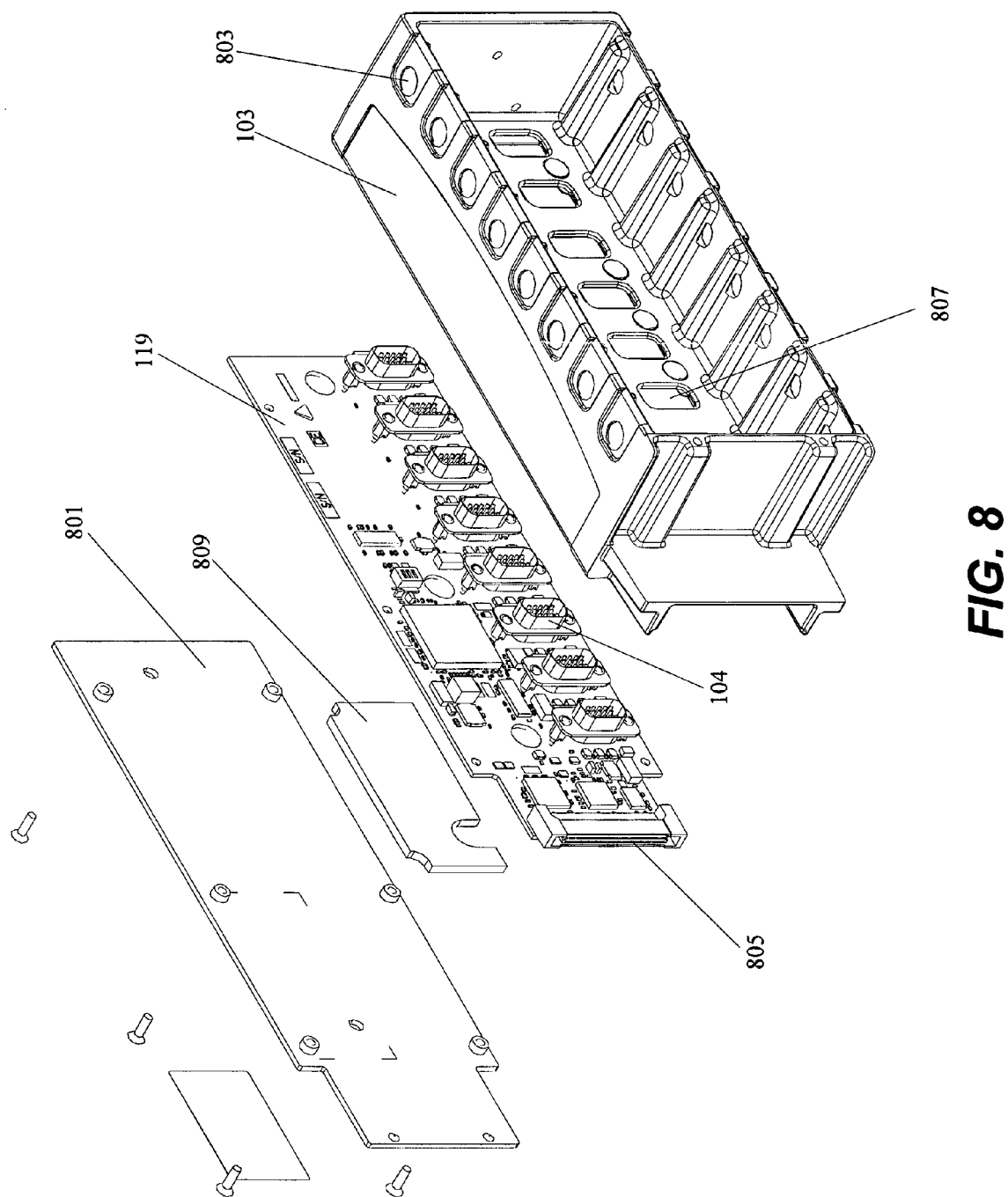
FIG. 8 illustrates an expanded view of a carrier, according to an embodiment.

FIG. 8: Carrier Components

FIG. 8 illustrates an expanded view of an embodiment of a housing portion of a carrier. In some embodiments, a carrier 103 may couple to a backplane 119 through screws (not shown) and back casing 801. In some embodiments, a gap pad 809 may be used between the back casing 801 and the backplane 119. In some embodiments, backplane connectors (e.g., backplane connector 104) may protrude through corresponding holes in the carrier 103 (e.g., hole 607). The backplane 119 may couple to one or more input measurement modules 101 and interface the input measurement modules 101 to a processor in the controller 115 through connector 805. For example, connector 805 may be an 80 pos media bay connector 805 (other connectors may also be used). Also, as seen in FIG. 8, depression 803 may be a round depression. In some embodiments, a corresponding clip projection on a module clip may be configured to engage the round depression 803 of the carrier 103. Other depression shapes (e.g., rectangular shaped depressions) and clip projections may also be used.

Figure 9:
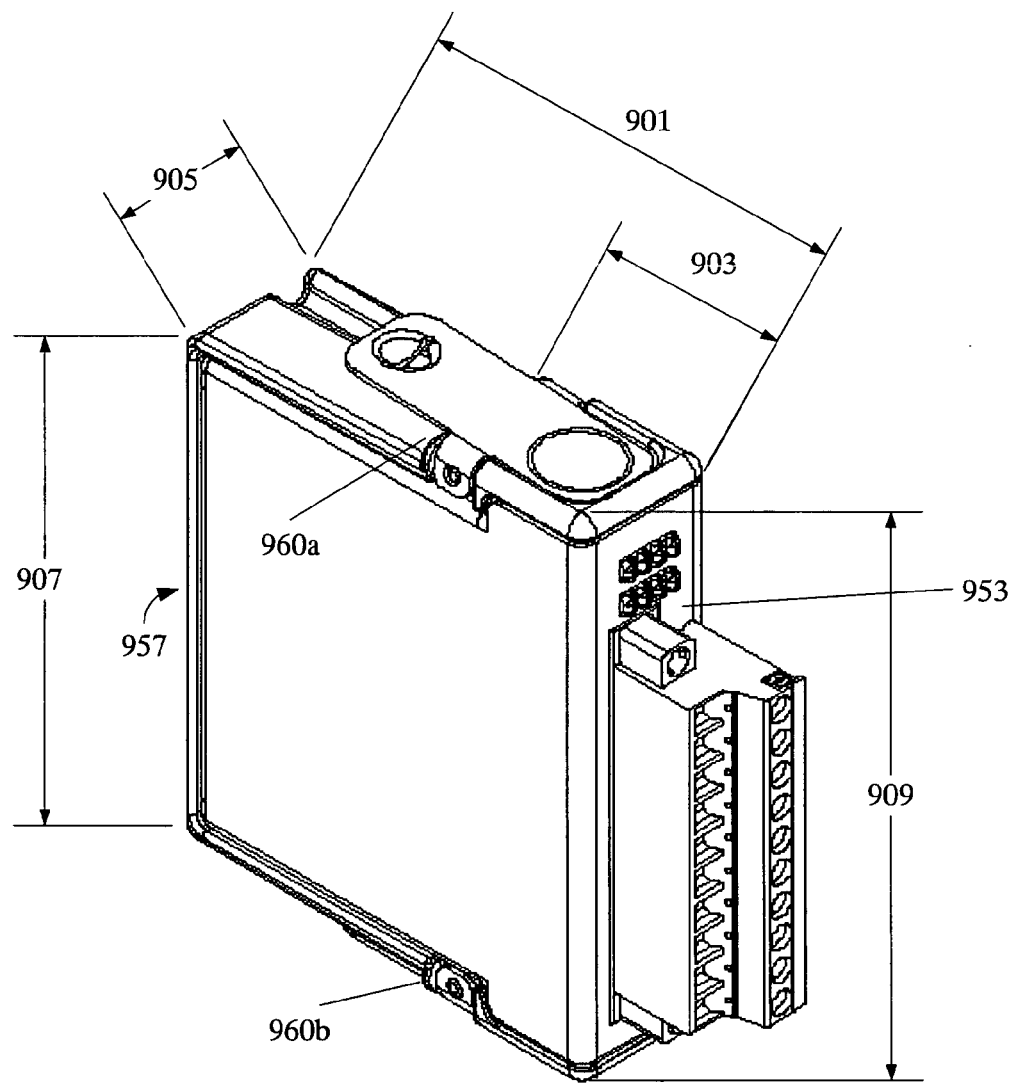
FIG. 9 illustrates an isometric view of an input measurement module including measurements, according to an embodiment.

FIG. 9: Input Measurement Module Dimensions

FIG. 9 illustrates an isometric view of an embodiment of an input measurement module 101 including exemplary dimensions. In some embodiments, an input measurement module may have a height 909 approximately in the range of 6 to 10 centimeters (cm), a width 905 approximately in the range of 1 to 3 cm, and a length 901 approximately in the range of 6 to 8 cm. In some embodiments, an input measurement module 101 may have a height 909 approximately in the range of 7 to 9 cm, a width 905 approximately in the range of 2 to 2.5 cm, and a length 901 approximately in the range of 6.5 to 7.5 cm. In some embodiments, the input measurement module 101 may have a stop 960a and, because of an offset caused by the stop 960a, a correspondingly smaller secondary height 907. In some embodiments, the input measurement module 101 may have an additional stop 960b on an opposing surface of the input measurement module 101 as stop 960a. In some embodiments, a stop distance 903 from the front face 953 of an input measurement module to the stop 960a (which may abut an edge of a carrier 103 when the input measurement module 101 is inserted into the carrier 103) may be approximately in the range of 2.5 to 3.5 cm. In some embodiments, the input measurement module 101 may slope from a front face 953 to a rear face 957. For example, a front height 909 may be approximately in a range of 8 to 9 cm and a secondary height 907 may be approximately in a range of 7.5 to 8.5 cm. The slope may further assist in inserting the input measurement module 101 into the carrier 103.

Figure 10:
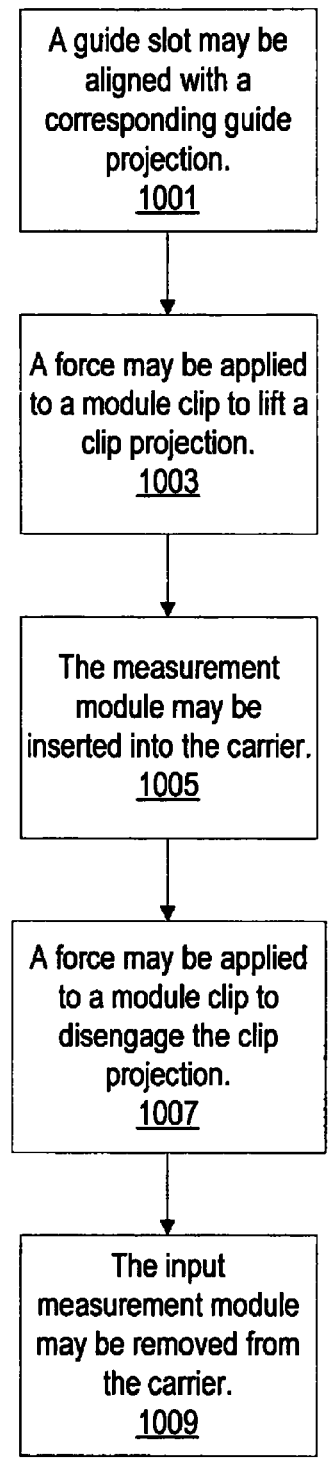
FIG. 10 illustrates a flowchart of an embodiment of a method for inserting and removing an input measurement module.

FIG. 10: Inserting and Removing the Input Measurement Module

FIG. 10 illustrates a flowchart of an embodiment of a method for inserting and removing an input measurement module. It should be noted that in various embodiments of the method described below, one or more of the elements described may be performed concurrently, in a different order than shown, or may be omitted entirely. Other additional elements may also be performed as desired.

At 1001, a guide slot may be aligned with a corresponding guide projection to align the input measurement module with the carrier. In some embodiments, the guide slot may be on the carrier and the corresponding guide projection may be on the input measurement module. In some embodiments, the guide slot may be on the input measurement module and the corresponding guide projection may be on the carrier. In various embodiments, multiple guide slots may be used. For example, the input measurement module may have two asymmetric guide slots with one asymmetric guide slot on an opposing side of the input measurement module as the other asymmetric guide slot. The asymmetric guide slots on the input measurement module may be aligned with corresponding guide projections on the carrier to insert the input measurement module into the carrier. The asymmetric guide slots may prevent the input measurement module from being improperly inserted into the carrier.

At 1003, a force may be applied to a module clip coupled to the input measurement module or the carrier to lift a clip projection at the end of the module clip. In some embodiments, the input measurement module may be inserted into the carrier without applying a force to the module clip.

At 1005, the input measurement module may be inserted into the carrier. The clip projection on the module clip may engage the corresponding depression to secure the input measurement module to the carrier.

At 1007, a force may be applied to a module clip to disengage the clip projection on the module clip with the corresponding depression.

At 1009, the input measurement module may be removed from the carrier.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A module, comprising:
    a casing, wherein the casing comprises a module insertion guide;
    a circuit board at least partially enclosed in the casing;
    a backplane connector coupled to the circuit board;
    wherein the module is operable to be inserted into a carrier, wherein the module insertion guide is operable to align the module during insertion into the carrier;
    wherein the backplane connector is operable to interface the circuit board with a backplane of the carrier;
    wherein at least one latch is operable to physically secure the module to the carrier upon said insertion; and
    wherein the at least one latch comprises a clip projection operable to engage a corresponding depression on an exterior surface of the carrier upon insertion of the module into the carrier, and wherein at least a portion of the at least one latch overlaps the exterior surface of the carrier when the at least one latch engages the corresponding depression.

2. The module of claim 1, wherein the module insertion guide comprises two or more module insertion guides and wherein at least two of the two or more module insertion guides are mutually asymmetric.

3. The module of claim 2, wherein the two or more module insertion guides are on opposing sides of the casing and are operable to engage corresponding guides on opposing interior surfaces of the carrier to align the module in a correct orientation for insertion into the carrier.

4. The module of claim 1, wherein the module is a reconfigurable input/output module.

5. The module of claim 1, wherein the casing has a height approximately in a range of 6 to 10 centimeters (cm), a width approximately in a range of 1 to 3 cm, and a length approximately in a range of 6 to 8 cm.

6. The module of claim 1, wherein the casing has a height approximately in a range of 7 to 9 cm, a width approximately in a range of 2 to 2.5 cm, and a length approximately in a range of 6.5 to 7.5 cm.

7. The module of claim 1, further comprising a front connector on a front of the module operable to be exterior to the carrier when the module is inserted in the carrier.

8. The module of claim 1, further comprising at least one indicator light on a front face of the casing.

9. The module of claim 1, wherein the casing comprises a first outer casing and a second outer casing, wherein the first outer casing couples to the second outer casing through a fastening mechanism and wherein the first outer casing and the second outer casing substantially enclose the circuit board when the first outer casing is coupled to the second outer casing through the fastening mechanism.

10. The module of claim 9, wherein the fastening mechanism comprises at least one screw and the first outer casing couples to the second outer casing through the at least one screw proximate to the backplane connector.

11. The module of claim 1, wherein the at least one latch is spring loaded.

12. The module of claim 1, wherein the carrier comprises:
    an enclosure;
    a heat sink coupled to the enclosure; and
    a controller comprising a processor board and a power supply board, wherein the controller is coupled to the enclosure.

13. The module of claim 1, wherein the casing is sloped along at least two opposing sides, wherein the at least two opposing sides slope toward each other toward a back of the module that includes the backplane connector.

14. The module of claim 13, wherein the two opposing sides slope toward each other toward a back of the module that includes the backplane connector.

15. The module of claim 1, wherein the module insertion guide comprises at least two asymmetric guide slots, wherein at least one asymmetric guide slot, of the at least two asymmetric guide slots, is on an opposing side of the module as another asymmetric guide slot, of the at least two asymmetric guide slots, and wherein the at least two asymmetric guide slots on the module are operable to be aligned with corresponding guide projections on opposing interior surfaces of the carrier to align the module with the carrier.

16. The module of claim 1,
    wherein the at least one latch comprises a first latch and wherein the module further comprises a second latch on an opposing side of the casing as the first latch;
    wherein the corresponding depression comprises a first corresponding depression and wherein the carrier further comprises a second corresponding depression; and
    wherein the first latch is operable to engage the first corresponding depression on the exterior surface of the carrier and the second latch is operable to engage the second corresponding depression on an exterior surface of the carrier on an opposite side of the carrier as the first corresponding depression upon insertion of the module into the carrier.

17. A module operable to be inserted into a carrier, comprising:
    a circuit operable to condition a measurement signal;
    a casing substantially enclosing the circuit;
    a connector coupled to the casing and to the circuit, wherein the connector is operable to couple the circuit to a backplane;
    an alignment device on the casing, wherein the alignment device is operable to align the casing with the carrier as the casing is inserted into the carrier, wherein the alignment device comprises two or more module insertion guide slots on the casing operable to engage two or more guides projections on the carrier, and
    a latch, wherein the latch comprises a clip projection operable to engage a corresponding depression on an exterior surface of the carrier, and wherein the latch is operable to physically secure the casing to the carrier when the casing is inserted into the carrier.

18. The module of claim 17, wherein the module is a reconfigurable input/output module.

19. The module of claim 17, wherein the casing has a height approximately in a range of 6 to 10 centimeters (cm), a width approximately in a range of 1 to 3 cm, and a length approximately in a range of 6 to 8 cm.

20. The module of claim 17, wherein the casing has a height approximately in a range of 7 to 9 cm, a width approximately in a range of 2 to 2.5 cm, and a length approximately in a range of 6.5 to 7.5 cm.

21. The module of claim 17, wherein the latch engages the corresponding depression on the exterior surface of the carrier after insertion of the module into the carrier.

22. The module of claim 17, wherein the casing comprises a first outer casing and a second outer casing, wherein the first outer casing couples to the second outer casing through a fastening mechanism and wherein the first outer casing and the second outer casing substantially enclose the circuit board when the first outer casing is coupled to the second outer casing through the fastening mechanism.

23. The module of claim 17, wherein the carrier comprises:
an enclosure;
a heat sink coupled to the enclosure; and
a controller comprising a processor board and a power supply board, wherein the controller is coupled to the enclosure.

24. The module of claim 17, wherein the latch comprises at least one latch on an exterior surface of the carrier.

25. The module of claim 17, wherein the two or more module insertion guide slots comprise at least two asymmetric guide slots, wherein at least one asymmetric guide slot, of the at least two asymmetric guide slots, is on an opposing side of the casing as another asymmetric guide slot, of the at least two asymmetric guide slots, and wherein the asymmetric guide slots on the casing are operable to be aligned with corresponding guide projections, of the two or more guide projections, on opposing interior surfaces of the carrier to align the module with the carrier.

26. A method for inserting an input measurement module into a carrier, comprising:
aligning at least one guide slot with at least one corresponding guide projection to align the input measurement module with the carrier;
inserting the input measurement module into the carrier; and
engaging a clip projection on at least one module clip coupled to the input measurement module to a corresponding depression on an exterior surface of the carrier when the input measurement module is inserted into the carrier to secure the input measurement module to the carrier, wherein at least a portion of the at least one module clip overlaps the exterior surface of the carrier when the clip projection engages the corresponding depression.

27. The method of claim 26, wherein at least one of the at least one guide slot is on the carrier and at least one of the at least one guide projection is on the input measurement module.

28. The method of claim 26, wherein at least one of the at least one guide slot is on the input measurement module and at least one of the at least one guide projection is on the carrier.

29. The method of claim 26, further comprising applying force to at least one of the at least one module clip coupled to the input measurement module prior to the inserting the input measurement module into the carrier.

30. The method of claim 26, wherein the input measurement module comprises the at least one guide slot, wherein the at least one guide slot comprises at least two asymmetric guide slots, wherein at least one asymmetric guide slot, of the at least two asymmetric guide slots, is on an opposing side of the input measurement module as another asymmetric guide slot, of the at least two asymmetric guide slots, and wherein the asymmetric guide slots, of the at least two asymmetric guide slots, on the input measurement module are operable to be aligned with corresponding guide projections, of the at least one corresponding guide projection, on opposing interior surfaces of the carrier to align the input measurement module with the carrier.

31. The method of claim 26, further comprising:
applying force to the at least one module clip to disengage the clip projection on the at least one module clip from the corresponding depression; and
removing the input measurement module from the carrier.

* * * * *